(12) United States Patent
Zhuang

(10) Patent No.: US 7,948,069 B2
(45) Date of Patent: May 24, 2011

(54) SURFACE MOUNTABLE HERMETICALLY SEALED PACKAGE

(75) Inventor: Weidong Zhuang, Worcester, MA (US)

(73) Assignee: International Rectifier Corporation, El Segundo, CA (US)

( * ) Notice: Subject to any disclaimer, the term of this patent is extended or adjusted under 35 U.S.C. 154(b) by 785 days.

(21) Appl. No.: 11/044,933

(22) Filed: Jan. 27, 2005

(65) Prior Publication Data

US 2005/0167789 A1 Aug. 4, 2005

Related U.S. Application Data

(60) Provisional application No. 60/540,224, filed on Jan. 28, 2004.

(51) Int. Cl.
*H01L 23/02* (2006.01)

(52) U.S. Cl. ........ 257/678; 257/693; 257/703; 257/704; 257/E21.499; 257/E23.193

(58) Field of Classification Search ............. 257/703, 257/704, 711, 678, 693, E21.499, E23.106, 257/E23.193
See application file for complete search history.

(56) References Cited

U.S. PATENT DOCUMENTS

| | | | | |
|---|---|---|---|---|
| 5,814,883 | A | * | 9/1998 | Sawai et al. ............... 257/712 |
| 5,821,617 | A | | 10/1998 | Autry et al. |
| 5,939,772 | A | * | 8/1999 | Hurst et al. ............... 257/659 |
| 6,111,199 | A | * | 8/2000 | Wyland et al. ............... 174/18 |
| 6,198,166 | B1 | * | 3/2001 | Coronati ................ 257/738 |
| 6,285,067 | B1 | * | 9/2001 | Hyoudo et al. ............ 257/529 |
| 6,329,065 | B1 | | 12/2001 | Ishida et al. |
| 6,459,149 | B1 | | 10/2002 | Shimoe et al. |
| 6,621,162 | B1 | * | 9/2003 | Ishida et al. ............... 257/728 |
| 6,713,857 | B1 | * | 3/2004 | Tsai ......................... 257/686 |
| 6,778,029 | B2 | * | 8/2004 | Mizusawa ................ 331/68 |
| 6,921,971 | B2 | * | 7/2005 | Basho et al. .............. 257/706 |
| 6,984,076 | B2 | * | 1/2006 | Walker et al. ............. 385/94 |
| 2002/0011352 | A1 | * | 1/2002 | Yoshisato et al. .......... 174/260 |
| 2002/0060356 | A1 | | 5/2002 | Nishibori et al. |
| 2003/0013234 | A1 | | 1/2003 | Bregante et al. |
| 2003/0183920 | A1 | | 10/2003 | Goodrich et al. |

FOREIGN PATENT DOCUMENTS

| | | |
|---|---|---|
| EP | 0 544 915 | 6/1993 |
| EP | 1 050 906 | 11/2000 |

\* cited by examiner

*Primary Examiner* — Khiem D Nguyen

(74) *Attorney, Agent, or Firm* — Farjami & Farjami LLP

(57) ABSTRACT

A high reliability package which includes electrical terminals formed from an alloy of tungsten copper and brazed onto a surface of a ceramic substrate.

18 Claims, 4 Drawing Sheets

SURFACE MOUNTABLE HERMETICALLY SEALED PACKAGE

RELATED APPLICATION

This application is based on and claims the benefit of U.S. Provisional Application Ser. No. 60/540,224, filed Jan. 28, 2004, entitled Surface Mount Hermetic Power Package, to which a claim of priority is hereby made and the disclosure of which is incorporated by reference.

FIELD OF INVENTION

The present invention relates to semiconductor device packages and more particularly to high reliability semiconductor device packages.

BACKGROUND OF THE INVENTION

A high reliability semiconductor package typically includes a semiconductor device which is hermetically sealed in a housing portion thereof. Typical semiconductor devices used in high reliability semiconductor packages are power MOSFETs, bipolar transistors, Schottky diodes, PN junction diodes, and IGBTs.

Hermetic surface mount packages, leadless chip carriers and ceramic leadless chip carriers (also known as LCC and CLCC respectively) have served as high reliability platforms for more than 20 years.

In the recent years, a vast array of electronic designs have been integrating new surface mount packages (also referred to as surface mounted devices or SMDs) which have surface mountable terminals on a common surface thereof. Such SMDs are desirable due to their smaller size and footprint, lighter weight, and excellent thermal performance. In addition, many high frequency circuit designs benefit from the inherently low inductance and low resistance of such SMDs.

The following are some more advantages of such SMDs:
1) very low profile when compared to TO- and MO-types of packages;
2) light weight;
2) ideal for single MOSFET, IGBT and BJT die;
3) capable of dissipating very high power due to low thermal resistance from junction to case and employing low electrical resistance material for terminal design;
4) extremely reliable at package level and when used on CCA and CIC type of boards;
5) when used as building blocks for high reliability power modules, they can be pre-screened to give high yield at module level.

The following are some of the disadvantages of such SMDs:
1) thermal and reliability performance are largely nullified when they are used on organic printed circuit boards;
2) all connections are on the same plane which makes soldering, cleaning and inspection difficult;
3) problems with testing when multiple chips are packaged (e.g. synchronous rectifiers);
4) additional ceramic carriers are used to provide electrical isolation, stress relief to the leads, which may add many problems such as difficulty in inspection, significant increase of thermal resistance, and more cost;
5) cost is about four times higher than an ordinary TO-packages with comparable cavity size.

It would be desirable to have a package which exhibits the advantages, but not the disadvantages of the prior art SMDs.

SUMMARY OF THE INVENTION

The following are the objectives of the present invention:
1) a hermetic power package which is capable of passing high electrical current (e.g. 200 Amps or more per terminal) and withstand high electrical voltage between terminals (e.g. up to 2 kV);
2) a package that has a low profile and is surface mountable (solderable to CCA or epoxy attach to heat sink);
3) a package that is thermally efficient;
4) a package that has a large cavity to host a power chip such as a power MOSFET, IGBT and any associated free-wheeling diode(s);
5) a package which has 4 or 5 terminals for $V_{CE}$ sensing (IGBT), and can be used as a building block for high reliability power modules;
6) a multi-terminal package which can be adapted for use in a variety of stand-alone power modules or power hybrid applications (e.g. synchronous rectifiers);
7) a package which incorporates mature technology, bearing the cost in mind.

A package according to the first embodiment of the present invention includes a substrate having an opening therein, a power semiconductor switch disposed within the opening, preferably four terminals brazed onto one major surface of the substrate near the mouth of the opening on the first surface of the substrate, another terminal attached to a second opposing major surface of the substrate and hermetically closing the mouth of the opening at the second surface of the substrate, and a cover hermetically closing the mouth of the opening at the first surface of the substrate. In a package according to the first embodiment, the terminal on the second surface of the substrate serves as an electrical terminal and a thermal path for the heat that is generated by the power semiconductor device.

A package according to the second embodiment of the present invention includes a substrate with a recess therein, a power semiconductor switch disposed within the recess, and terminals on one surface of the substrate only. In a package according to the second embodiment, the heat generated by the power semiconductor device is transmitted through the body of the substrate.

A package according to the present invention may also include at least one power diode such as a power Schottky diode, which may serve as a free wheeling diode of the power semiconductor switch of the package or a power semiconductor device outside of the package. In the preferred embodiment, two Schottky diodes are contained within the same package.

According to one aspect of the present invention the terminals are formed from an alloy of tungsten and copper. The low electrical resistivity and thermal properties of tungsten copper impart desirable characteristics to a package according to the present. Specifically, the low electrical resistivity of a tungsten copper alloy allows for higher current handling and thus lower power dissipation, and the coefficient of thermal expansion of improves the reliability of the package, making it suitable for high reliability applications.

Other features and advantages of the present invention will become apparent from the following description of the invention which refers to the accompanying drawings.

DETAILED DESCRIPTION OF THE FIGURES

Figure 1:
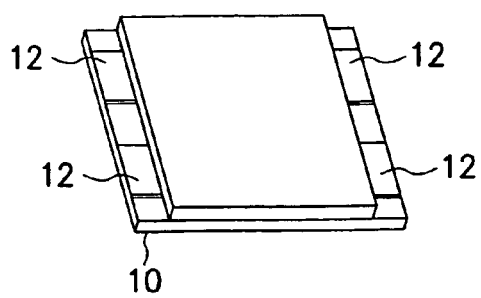
FIG. 1 shows a perspective top view of a package according to the present invention.
Figure 2:
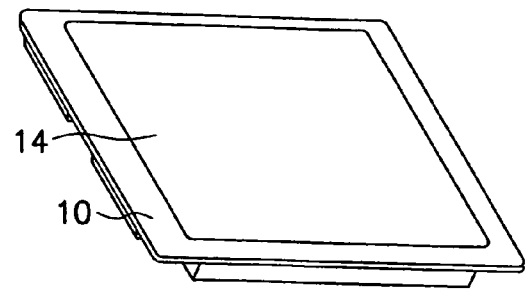
FIG. 2 shows a perspective bottom view of a package according to the present invention.
Figure 3:
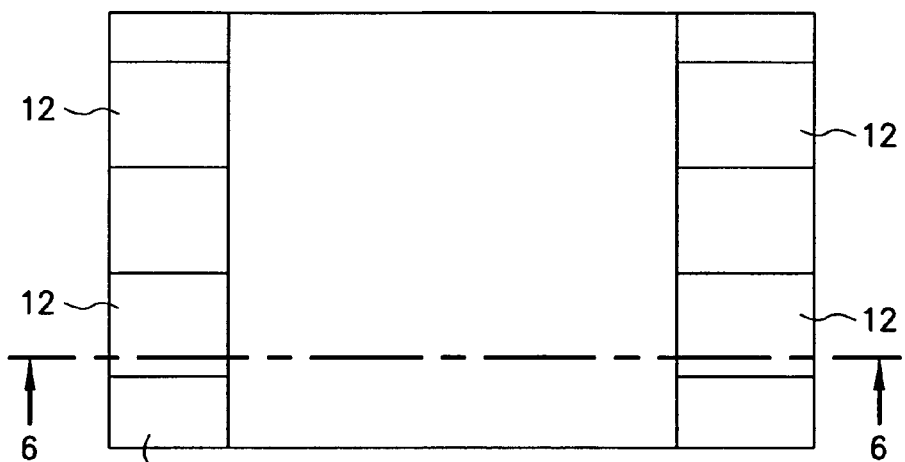
FIG. 3 is a top plan view of a package according to the present invention.
Figure 4:
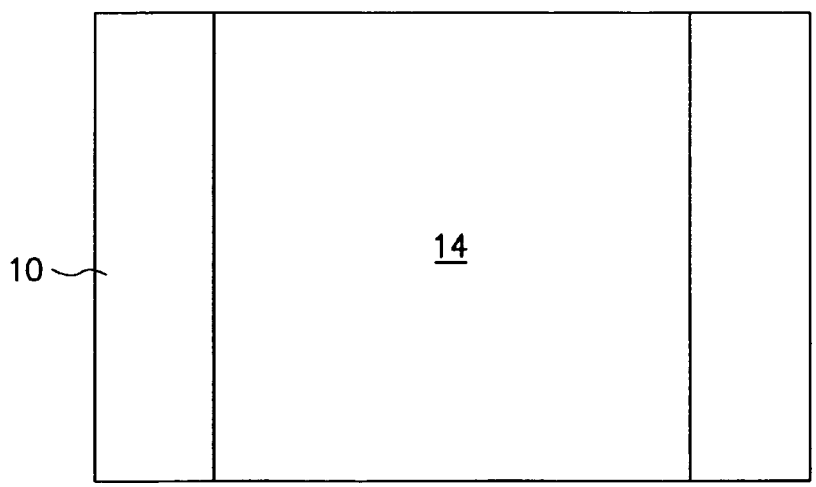
FIG. 4 is a bottom plan view of a package according to the present invention.

Referring to FIGS. 1-4, a semiconductor package according to the first embodiment of the present invention includes a substrate 10 having a first terminal 12 on a first major surface thereof, and another second electrical terminal 14 on another opposing major surface thereof. As seen in FIGS. 1 and 3, a package according to the first embodiment may include three other first electrical terminals 12 on the first major surface of substrate 10. As a result, a package according to the first embodiment is a five terminal package. It should be noted that a package according to the present invention is not required to have five terminals, and that fewer or more terminals may be included without deviating from the scope and the spirit of the present invention.

Figure 5:
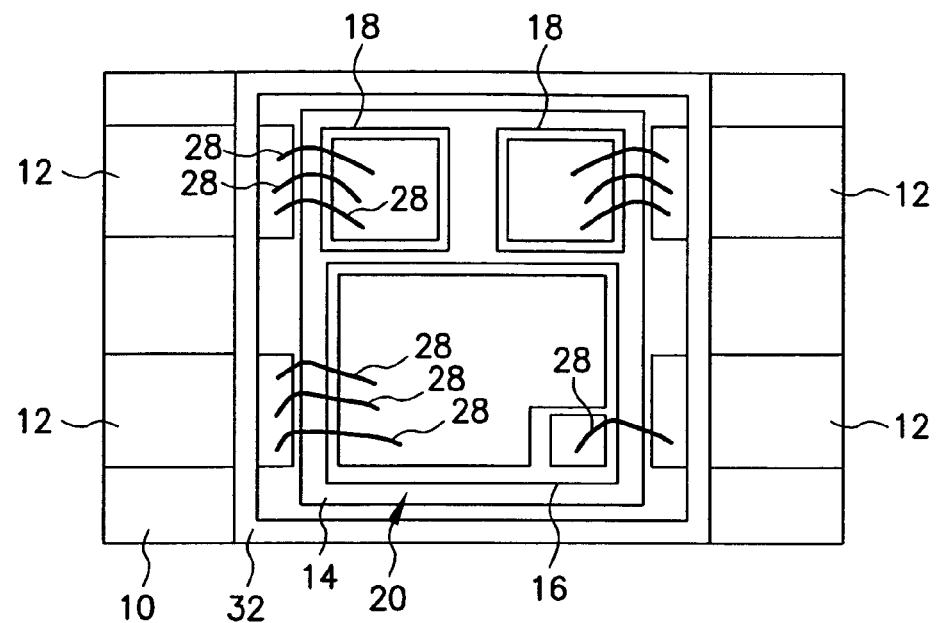
FIG. 5 shows a top plan view of a package according to the present invention with its lid removed to illustrate the interior arrangement thereof.

Referring now to FIG. 5, a package according to the first embodiment of the present invention includes a semiconductor power switch 16, and power diodes 18. Power switch 16 and diodes 18 are electrically and mechanically attached to second terminal 14 which is accessible through an opening 20 in substrate 10.

In the preferred embodiment of the present invention, power switch 16 may be an IGBT. However, a power MOSFET or any other power semiconductor device may be used without deviating from the scope and spirit of the present invention. In addition, in the preferred embodiment, diodes 18 are Schottky diodes. At least one of the Schottky diodes can be parallel connected with the IGBT and serve as a free-wheeling diode, thus rendering the package suitable for power applications such as a synchronous rectifier application.

Figure 6:
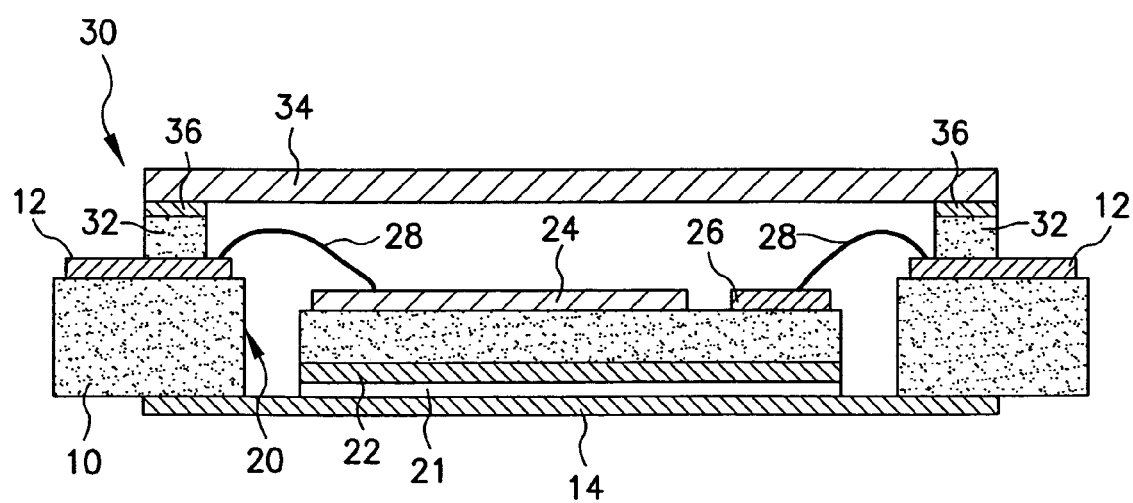
FIG. 6 is a cross-section of a package according to the present invention along line 6-6 and viewed in the direction of the arrows.

Referring now to FIG. 6, power switch 16 includes a first power electrode 22 which is electrically and mechanically connected to second terminal 14 by a layer of conductive adhesive material 21 such as solder. Power switch 16 further includes a second power electrode 24 which is positioned opposite to first power electrode 22, and control electrode 26, which is also positioned opposite first power electrode 22.

In the preferred embodiment, in which an IGBT is used, first power electrode 22 is the collector contact, second power electrode 24 is the emitter contact, and control electrode 26 is the gate contact. In the preferred embodiment, second power electrode 24 and control electrode 26 can be connected electrically to respective first terminals 12 on the first major surface of substrate 10 by wire bonds 28 or the like. A package according to the present invention, however, is not restricted to the use of wire bonds. Conductive clips, straps or the like may also be used without deviating form the scope and spirit of the present invention.

Although not shown specifically, diodes 18 are connected to respective electrical terminals in a similar manner. Specifically, the cathode of each diode 18 may be electrically and mechanically connected by a conductive adhesive such as solder to second terminal 14, while its anode electrode may be electrically connected to a respective first terminal 12 by wire bonds 28 or the like.

A package according to the present invention further includes cover 30 which encloses power semiconductor switching device 16 and power diodes 18 within opening 20 in substrate 10.

According to one aspect of the present invention, opening 20 in substrate 10 is hermetically sealed. Specifically, second terminal 14 is selected to have a larger area than the mouth of opening 20 at the second major surface of substrate 10 such that when placed thereon its periphery will be disposed on a portion of the second major surface of substrate 10 whereby the mouth of opening 20 at the second major surface of substrate 10 is closed. To render the mouth of opening 20 at the second major surface of substrate 10 hermetically sealed, second terminal 14 may be hermetically attached to the second major surface of substrate 10 at the periphery thereof by any known method such as brazing or the like.

Furthermore, cover 30 is hermetically attached to the first major surface of substrate 10 to hermetically seal the devices contained within opening 20. Specifically, cover 30 includes enclosure 32 which is disposed around the mouth of opening 20 at the first major surface of substrate 10 and hermetically connected to the same. As seen in FIGS. 5 and 6, the dimensions of enclosure 32 are selected such that a portion of each first terminal 12 is disposed within enclosure 32 to receive wire bonds 28, and a portion of each terminal is outside of enclosure 32 and is available for external connection.

Cover 30 further includes lid 34, which is hermetically attached to enclosure 32 by hermetic seal 36. As a result, cover 30 hermetically closes the mouth of opening 20 at the first major surface of substrate 10, and thus power semiconductor switching device 16, and power diodes 18 are contained within a hermetically sealed compartment created by opening 20, second terminal 14 and cover 30.

According to one aspect of the present invention, first terminals 12, and second terminal 14 are composed of an alloy of tungsten copper. For example, a tungsten copper alloy in which about 80% of the total weight is tungsten and about 20% of the total weight is copper can be used to form terminals 12, 14. Alternatively, a tungsten copper alloy in which about 85% of the total weight is tungsten and about 15% of the total weight is copper is used to form terminals 12, 14. The term about as used herein is meant to indicate that the amount of copper may vary from 0% to 25% without compromising the beneficial characteristics of the alloy.

In the preferred embodiment of the present invention, enclosure 32 is composed of a ceramic such as alumina, substrate 10 is composed of a ceramic such as alumina, lid 34 is composed of Kovar or Alloy 42, and hermetic seal 36 is composed of a conventional gold-tin alloy in which preferably about 80% of the total weight is gold and about 20% of the total weight is tin.

Also, in the preferred embodiment, conductive adhesive 21 is composed of a lead-based solder.

Figure 7:
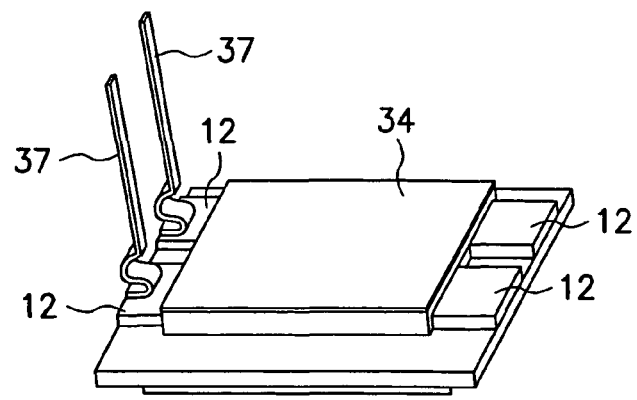
FIGS. 7-9 illustrate alternative embodiments of a package according to the present invention.
Figure 8:
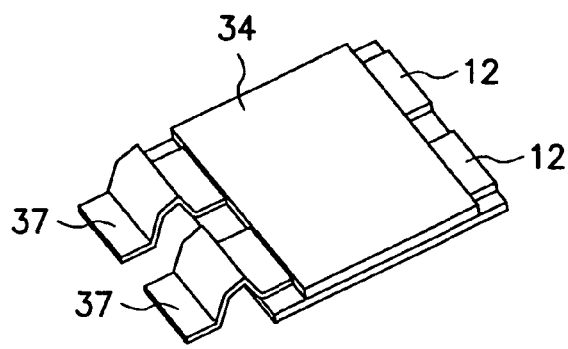
Figure 9:
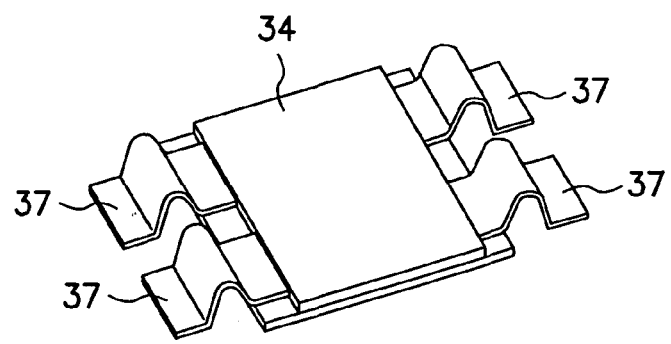

Referring to FIG. 7, a package according to the present invention may include external electrical connectors 37, each electrically and mechanically attached to a respective first terminal 12. As seen in FIG. 7, connectors 37 may extend vertically away from terminals 12, or bend downwardly to become coplanar with terminal 14 as seen in FIG. 8. Furthermore, instead of only two, all four terminals may have an electrical connector 37 attached thereto.

Figure 10:
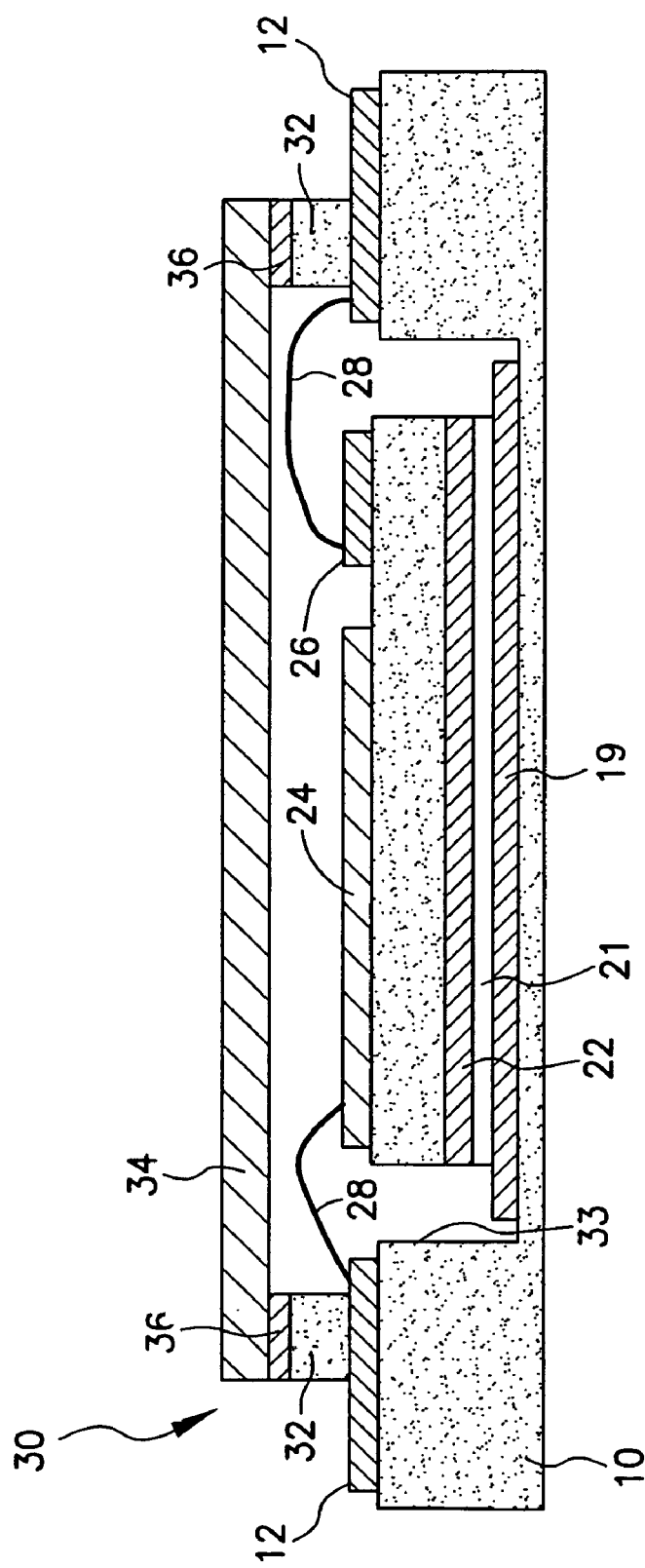
FIG. 10 is a cross-section of a package according to a second embodiment of the present invention along line 6-6 in FIG. 3 and viewed in the direction of the arrows.

A package according to the second embodiment may not include second terminal 14. Thus, in a second embodiment, only first terminals 12 may be available for electrical connection. Referring for example to FIG. 10, power switch 16 and diodes 18 may be disposed on an electrically conductive plate 19 which is attached by brazing or the like to the bottom of recess 33 in substrate 10. Alternatively, power switch 16 and diodes 18 are disposed directly on the bottom surface of recess 33.

Thus, in the first embodiment, second terminal 14 functions as a terminal for electrical connection as well as a thermal path for transmitting heat that is generated by power switch 16 and power diodes 18, and in the second embodiment the heat so generated is transmitted through the body of substrate 10.

To manufacture a package according to the present invention, preferably, substrate 10 is slip cast, and dried. Thereafter, opening 20 is formed in substrate 10 by punching or the like. Next, Mo—Mn or W is metallized onto areas of substrate 10 that are to receive terminals 12, 14, and substrate 10 and the metallizations are co-fired. The, terminals 12, 14 are attached to substrate 10 by brazing or the like, and, thereafter, preferably plated with nickel or gold. Power switch 16 and diodes 18 are then soldered in place, and cover 30 is installed.

Table 1 sets forth a comparison of a package according to the present invention to prior art surface mounted devices.

Also, in a package according to the present invention, the thermal spreading is efficient due to having terminals which are bonded to the substrate.

At high frequency switching the skin effect must be considered. The skin effect can be taken into account with the following formula:

$$X = 2\pi a (2 * f * \mu / \rho)^{1/2}$$

x: skin effect ratio
a: radius of conductor in centimeters
f: frequency in cycles per second
μ: magnetic permeability of conductor
ρ: resistivity in nano-ohms centimeter In a package according to the present invention, at switching frequency of 20 kHz, the skin effect ratio has been calculated to be about 4.9 for a terminal composed of an alloy containing tungsten (about 80% of total weight) and copper (about 20% of the total weight). Thus, it has been observed that the effective resistance of the terminal is doubled at 20 kHz as compared to its resistance at DC. This is much better than standard copper-cored alloy 52 leads used in prior art hermetic packages. Thus, at 200 Amps the temperature rise of a terminal may be as much as 11.7° C.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

TABLE I

| Package Type | Package Outline (in) | Cavity Size (in) | Cavity/Outline Area Ratio | Overall Height (in) |
|---|---|---|---|---|
| SMD0.5 | 0.400" × 0.300" | 0.203" × 0.168" | 0.284 | 0.123" |
| SMD1 | 0.625" × 0.450" | 0.338" × 0.338" | 0.406 | 0.141" |
| SMD2 | 0.690" × 0.525" | 0.403" × 0.403" | 0.448 | 0.141" |
| SMD3 | 0.775" × 0.500" | 0.395" × 0.293" | 0.298 | 0.141" |
| Embodiment of Invention | 1.180" × 1.030" | 0.910" × 0.620" | 0.464 | 0.150" |

When a size 8.8 IGBT such as IRG4CC88KB (available from International Rectifier) is used in a package according to the present invention, the following is observed (assume pb-based solder for conductive adhesive which is 0.003" thick):

The IGBT is dissipating 500W.
The Base temperature is at 70° C.
Junction temperature rise is 21° C.
Junction to base thermal resistance is about 0.042° C./W (ideal die attach, 0% void).

When power Schottky diodes (0.170"×0.170"×0.015") such as HF50D060ACE (available from International Rectifier) are used, the following is observed (assume pb-based solder for the conductive adhesive which is 0.003" thick):

Each diode dissipates 250W.
Base temperature is at 70° C.
Junction temperature rise is 46.5° C.
Junction to base thermal resistance is about 0.19° C./W (ideal die attach, 0% void).

In a package according to the present invention, when 200 Amps (DC) is passing through a single first terminal 12, the terminal only dissipates about 3.5W due to ohmic heating when the package base is at 25° C. Also, the peak temperature rise is about 6° C.

What is claimed is:
1. A semiconductor package comprising:
a flat substrate, said substrate including a first major surface and a second major surface opposite said first major surface, and an opening therethrough;
a first electrical terminal on said first major surface of said substrate;
a second electrical terminal attached to said second major surface of said substrate and being wider than said opening such that said second electrical terminal closes said opening;
a semiconductor die disposed in said opening and having a first electrode electrically connected to said first electrical terminal and a second electrode disposed opposite said first electrode and electrically and mechanically connected to said second electrical terminal by a layer of conductive adhesive;
a hermetically sealed cover attached to said first major surface and closing said opening;
wherein said first electrical terminal and said second electrical terminal each have a surface for external electrical connection outside said package;
wherein said second electrical terminal being wider than said opening enables said package to pass a current of approximately 200 A and withstand a voltage between said electrical terminals of approximately 2 kV.

2. A semiconductor package according to claim 1, wherein said substrate is comprised of a ceramic material.

3. A semiconductor package according to claim 1, wherein said substrate is comprised of alumina.

4. A semiconductor package according to claim 1, wherein said terminals are comprised of a copper tungsten alloy.

5. A semiconductor package according to claim 4, wherein said alloy substantially consists of 80% tungsten and 20% copper by weight.

6. A semiconductor package according to claim 4, wherein said alloy substantially consists of 85% tungsten by weight and 15% copper by weight.

7. A semiconductor package according to claim 1, wherein said hermetically sealed cover includes a ceramic enclosure disposed around said semiconductor die and hermetically attached to said substrate, and a lid hermetically attached to said ceramic enclosure.

8. A semiconductor package according to claim 7, further comprising a hermetic seal disposed between said lid and said ceramic enclosure.

9. A semiconductor package according to claim 8, wherein said hermetic seal is comprised of 80% gold and 20% tin by weight.

10. A semiconductor package according to claim 7, wherein said lid is comprised of either Kovar or Alloy 42.

11. A semiconductor package according to claim 1, wherein said first electrical terminal on said first major surface of said substrate is electrically and mechanically connected to said first electrode by a layer of conductive adhesive.

12. A semiconductor package according to claim 11, wherein said conductive adhesive is solder.

13. A semiconductor package according to claim 12, wherein said solder is lead based.

14. A semiconductor package according to claim 1, wherein said semiconductor die is a power switching device.

15. A semiconductor package according to claim 14, wherein said power switching device is either a power MOSFET or an IGBT.

16. A semiconductor package according to claim 14, further comprising at least one diode electrically and mechanically connected to said second electrical terminal.

17. A semiconductor package according to claim 1, further comprising a third electrical terminal adjacent said first electrical terminal.

18. A semiconductor package according to claim 17, wherein said first and said third electrical terminals are disposed along one edge of said substrate and further comprising a fourth and a fifth electrical terminal disposed along another opposing edge of said substrate.

* * * * *